United States Patent [19]

Hahn

[11] Patent Number: 4,552,791
[45] Date of Patent: Nov. 12, 1985

[54] PLASTIC CONTAINER WITH DECREASED GAS PERMEABILITY

[75] Inventor: Granville J. Hahn, Big Spring, Tex.

[73] Assignee: Cosden Technology, Inc., Dallas, Tex.

[21] Appl. No.: 560,065

[22] Filed: Dec. 9, 1983

[51] Int. Cl.[4] .............................................. B65D 90/06
[52] U.S. Cl. .................................... 428/35; 428/451; 428/702; 220/454; 220/457; 215/1 C
[58] Field of Search .......................... 428/35, 451, 702; 215/1 C; 220/457, 454

[56] References Cited

U.S. PATENT DOCUMENTS 4,069,933 1/1978 Newing .................................. 428/35
4,239,827 12/1980 Notaro .................................. 428/35

Primary Examiner—John E. Kittle
Assistant Examiner—James J. Seidleck
Attorney, Agent, or Firm—Michael J. Caddell; M. Norwood Cheairs

[57] ABSTRACT

A container made of an organic resin having improved vapor barrier characteristics is disclosed which achieves an improved barrier by the placement thereon of a thin coating of an inorganic material.

15 Claims, 2 Drawing Figures

PLASTIC CONTAINER WITH DECREASED GAS PERMEABILITY

BACKGROUND OF THE INVENTION

The present invention relates generally to plastic containers and more particularly discloses containers, such as bottles and cans, having improved gas transmission barrier characteristics.

In the food and beverage industry the trend is to move away from packaging perishable products in glass and metal containers and to substitute thermoplastic polymers for the container material. One of the most successful polymers for beverage containers to package beer, wine, and soft drinks has been polyethylene terephthalate (PET). One of the largest markets for PET containers has been in the two-liter carbonated drink field. Another area where PET is expected to be used extensively is in packaging beer and food. In either case, one of the most critical characteristics of the polyester package is the prevention of gas permeation through the wall of the container.

With carbonated soft drinks, the problem with gas permeation is the loss of carbonation ($CO_2$ gas) from the drink through the wall of the bottle or can. Compared to the small, densely-packed metal and glass molecules, polymer molecules are relatively large and form a porous wall. Even the best polymer known at this time for gas barrier properties, ethylene vinyl alcohol (EVOH), has poor barrier ability when compared to the inorganics such as metals and glass.

On the other hand, beer and food containers preferably should present a good vapor barrier against the ingress of oxygen ($O_2$) into the container because of the accelerated spoilation of the food products caused by the presence of oxygen therein.

While the use of PET two-liter containers has been relatively successful, its use in smaller-sized containers such as half-liter and one-third-liter, is very limited because of the greater surface-area-to-volume ratios of the smaller containers, compared to that of the two-liter container. This proportionate increase in the surface area causes a much more rapid loss of carbonation from and/or ingress of oxygen into the containers and thus decreases the "shelf-life" of the contained product.

There have been several different methods developed in an attempt to increase the "shelf-life" of plastic containers. One of the most common methods involves creating a multi-layered container having a thin barrier layer of a material such as EVOH or polyvinylidene chloride (PVdC) buried between two or more layers of a container polymer such as PET, polypropylene, polystyrene, or PVC. This multi-layer container is difficult and expensive to manufacture since the barrier layers are either expensive (EVOH) or corrosive (PVdC). Also the process for forming a multi-layered material and making a container from it may be much more complex than single-layer processes.

Another method of creating a barriered polymer container is the process known as "dip-coating". In this process a polymer bottle made of a material such as PET, is first formed into its final shape and then the additional step of dipping the container into a coating solution is performed. This solution may be of a barrier material such as PVdC. This process, in addition to adding another expensive step to the container manufacture, also introduces a material to the container that prevents easy recycling. Because of the nature of PVdC, the coating must be removed by solvents before the polymer container can undergo normal recycling. In light of the trend toward compulsive container return laws in various states and a probable federal deposit/return law, all future container designs must be quickly and easily recyclable. Dip-coated bottles do not lend themselves to easy recycling.

The present invention overcomes the deficiencies of the barrier-layer containers and the dip-coated containers by providing a barrier-treated plastic container which provides excellent barrier characteristics, is cheaply and easily treated, and can be completely recycled by conventional recycling techniques without need for removal of dip-coated layers.

This is achieved by impregnating the surface of a normal polymer container with an inorganic material such as a metallic oxide. The impregation is done by gasless ion plating to provide an ultra-thin flexible coating of the inorganic material on the plastic substrate.

DESCRIPTION OF THE PREFERRED EMBODIMENTS

In one embodiment of the present invention, a number of one-half liter polyester bottles (polyethylene terephthalate) were placed in a vacuum chamber and a vacuum of about $1 \times 10^{-5}$ Torr was drawn on the chamber. A plating source comprising silicon monoxide (SiO) was vaporized into a metallic oxide vapor. The vapor was ionized into a plasma by an RF energy source and then biased by a DC bias to impinge the substrate (bottle) surface with a sufficiently high energy level to penetrate the SiO ions partially into the substrate polymer. This process is generally the same as that disclosed for metallic and non-metallic substrates in U.S. Pat. Nos. 4,016,389, 4,039,416, Re 30,401, and 4,342,631, which patents are hereby incorporated by reference into this application.

Figure 1:
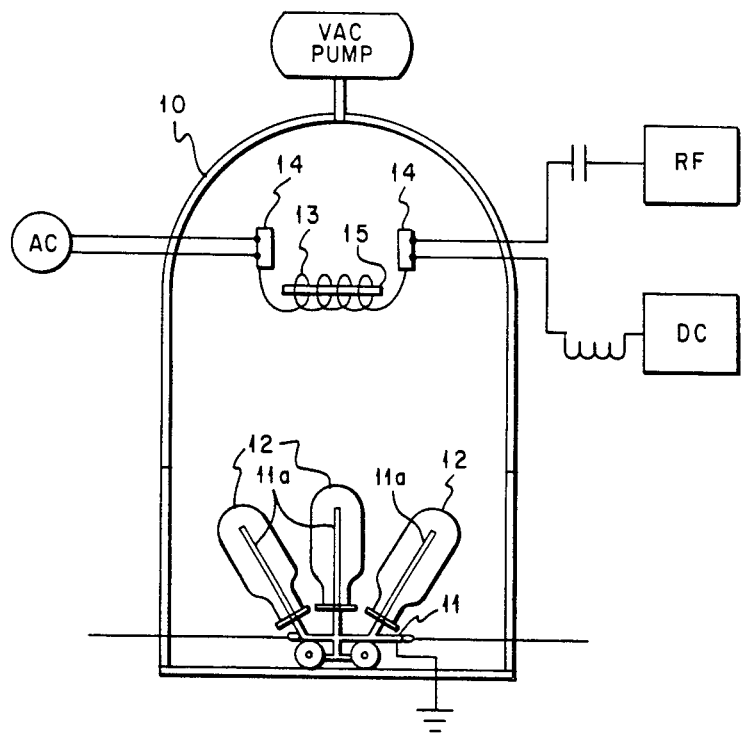
FIG. 1 is a schematic view of the process of the present invention.

Referring now to FIG. 1, which is a schematic illustration not drawn to scale, disclosed is a vacuum chamber 10 having a substrate holder 11 removably secured therein. At least one plastic bottle 12 is loosely held on the portable fixture 11 below a source of inorganic material 15 held in a vaporizing filament 13. Filament 13 is electrically connected to and supported by a pair of terminals 14. It preferably is a resistance heating element powered by an external AC power supply (not shown). As the coating material 15 held in filament 13 is vaporized by the filament, an ionizing energy, comprising RF (radio frequency), and a biasing DC voltage, are placed on the filament 13 with respect to the substrate holder 11 which is grounded.

As a result of the vaporization of the source material and the ionizing and biasing field created by the DC/RF power supply, a plasma of ionized SiO particles forms between the filament 13 and the substrate holder 11. The bias also accelerates the SiO ions toward the fixture 11a which is located inside the bottle 12. The ions impinge the outer surface of the polyester bottle while traveling at very high velocities and apparently even penetrate partially into the surface of the polymer. An even coating can be obtained by rotating the bottle 12 about one or more of its axes during the impingement cycle.

The impingement cycle is maintained long enough to obtain a coating layer of around 500 angstroms thickness. The result is a clear flexible coating of SiO on the outer surface of the polyester bottle, which it is believed actually penetrates partially into the polymer and plugs the interstices and porosities between the polymer chains. This plugging of the interstices is believed to be a main contributor to the improvement in gas barrier characteristics of the SiO coated container. While 500 Angstroms is considered a good coating thickness, other thicknesses ranging from less than 500 to as high as 5000 Angstroms or more might be used depending on the type of polymer, the container shape, and the size and thickness of the container.

For example a series of PET half-liter bottles were ion-plated with SiO, and the measured $CO_2$ transmission rate was reduced from $$4.0 \text{ to } 1.7 \frac{cc \cdot mil}{100 in^2 Day \cdot Atm.}$$

A pressure test was performed over a period of time to determine if flexure during filling or stretching under pressure by the container caused degradation or flaking off of the inorganic material. It was observed that flexure and creep did not significantly degrade the barrier characteristics. Manual flexure of several containers was also performed to test for cracking or flaking of the coating. After these steps were performed, acetone was applied to the coated surface to detect any breaks in the integrity of the coating. Since acetone will not attack inorganics like $SiO_2$ but is a strong solvent for the polymer, any break in the SiO coating would have allowed the acetone to attack the container polymer. No dissolving of the container was observed after application of the acetone to the outer surface. Thus flexure and creep not only had no effect on the barrier properties they also had no detrimental effect on the surface continuity of the coating.

In addition to the impingement coating of polyesters such as PET it is believed that most other polymers can also be coated successfully. It is also expected that other inorganic materials may be substituted for SiO, for example aluminum oxide and titanium oxide. Most inorganic or metallic oxides should be adaptable to this process. It should also be noted that even though the metals of these plating compounds are generally opaque, their oxides are clear and thus they can be used on both clear and pigmented polymers without affecting the aesthetics of the containers.

Recyclability of the used coated containers is not affected detrimentally because of the extremely small amount of inorganic coating used. Because of its inert nature and presence in small amounts, the coating will not be noticeable in the recycled polymer. The amount of inorganic coating is less than 1% by weight of the polymer in the container. Some containers have inorganic pigments such as titanium dioxide mixed with their polymers in amounts as high as 25% by weight without affecting recyclability; therefore it can be seen how negligible the effect of the coating material is on recyclability using the present invention.

Figure 2:
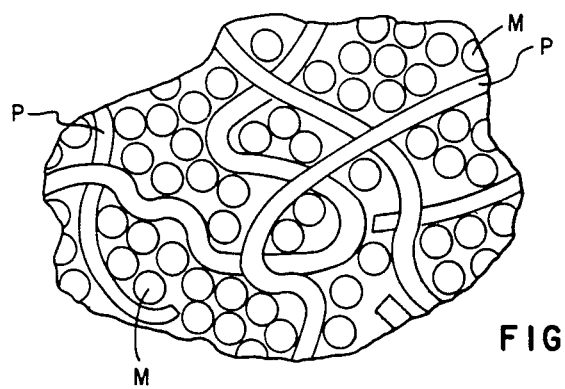
FIG. 2 is a magnified cross-sectional schematic view of a coated polymer material.

Referring now to FIG. 2, there is illustrated a schematic enlarged illustration of a section of the coated surface indicating how it is believed that the present invention increases barrier properties. In the drawing, which is not an attempt to show true scale, polymer molecules P are shown having long, winding structure which when combined together result in large openings therebetween. Inorganic metalic oxide molecules M, such as Silicon Oxide or Aluminum Oxide, are very small and compact and can be infiltrated into the interstices formed by the long bulky polymer molecules. Because of the vacuum environment around the substrate and the high velocity of impingement during the plating, the inorganic molecules can penetrate deeply into the polymer interstices, giving good binding between the coating and the substrate. A very thin layer, on the order of around 500 Angstroms, of the metallic oxide is applied to the substrate, giving a good barrier in the interstices and having sufficient flexibility to withstand breakage when flexed.

Although a specific preferred embodiment of the present invention has been described in the detailed description above, the description is not intended to limit the invention to the particular forms or embodiments disclosed therein since they are to be recognized as illustrative rather than restrictive and it will be obvious to those skilled in the art that the invention is not so limited. For example it is contemplated that plating materials other than silicon monoxide, aluminum oxide, and titanium oxide can be used. One such material would be tantalum oxide. Also containers other than carbonated beverage bottles would benefit from the present invention, such as beer containers, food containers, and medicine containers. Thus the invention is declared to cover all changes and modifications of the specific examples of the invention herein disclosed for purposes of illustration, which do not constitute departures from the spirit and scope of the invention.

The embodiments of the invention in which an exclusive property or privilege is claimed are defined as follows:

1. A container having decreased gas permeability through the walls thereof, said container comprising:
    a thermoplastic organic resin container having at least one sidewall portion and a bottom portion made of said resin; and,
    a thin layer of an inorganic oxide coating material ion-deposition plated on at least part of said sidewall portion.

2. The container of claim 1 wherein said resin is a polyester polymer and said inorganic coating is a metal oxide.

3. The container of claim 1 wherein said inorganic coating is silicon monoxide.

4. The container of claim 1 wherein said resin is a polyolefin and said coating is an inorganic oxide selected from the group consisting of tantalum oxide, titanium oxide, silicon monoxide and metallic oxides.

5. The container of claim 1 wherein said coating is up to about 500 Angstroms thick.

6. A polymer container having relatively thin walls and a reduced gas permeability therethrough, said container comprising:
    a structural body portion made of an organic resin polymer; and,
    a coating on said polymer comprising an inorganic oxide ion-plated thereon.

7. The container of claim 6 wherein said inorganic oxide is selected from the group consisting of silicon monoxide, tantalum oxide, and metallic oxides.

8. The container of claim 6 wherein said inorganic oxide is applied to said container by gasless ion plating.

9. The container of claim 8 wherein said inorganic oxide is up to about 500 Angstroms average thickness on said container.

10. A thermoplastic polymer container having decreased gas permeability through the walls thereof, said container comprising:

a body portion having an enclosed bottom portion, all made of a thin polymer selected from the group consisting of polyolefins and polyesters; and, an inorganic oxide coating deposited on said body portion by gasless ion plating in a layer of up to about 500 Angstroms thick.

11. The container of claim 10 wherein said coating is selected from the group comprising silicon oxides, tantalum oxides, and metallic oxides.

12. The container of claim 11 comprising a bottle made of polyethylene terephtahalate and a coating of an inorganic oxide.

13. The container of claim 11 comprising a bottle of polypropylene and a coating of an inorganic oxide.

14. The container of claim 12 wherein said oxide is silicon monoxide.

15. The container of claim 13 wherein said oxide is silicon monoxide.

* * * * *